United States Patent [19]
Seo

[11] Patent Number: 6,026,284
[45] Date of Patent: Feb. 15, 2000

[54] OUTPUT CONTROL UNIT OF MOBILE COMMUNICATION SYSTEM AND ITS CONTROLLING METHOD

[75] Inventor: Cheol-Soo Seo, Seoul, Rep. of Korea

[73] Assignee: SamSung Electronics Co., Ltd., Kyungki-do, Rep. of Korea

[21] Appl. No.: 08/867,339

[22] Filed: Jun. 2, 1997

[30]     Foreign Application Priority Data

May 31, 1996  [KR]  Rep. of Korea ............... 96-19238

[51] Int. Cl.[7] .................................................. H04B 1/04
[52] U.S. Cl. ........................... 455/115; 455/127; 330/284
[58] Field of Search .................................. 455/115, 118, 455/119, 127, 63, 75, 80, 91, 114, 116, 117, 522; 330/278, 279, 284, 298

[56]     References Cited

U.S. PATENT DOCUMENTS

| | | |
|---|---|---|
| 3,638,122 | 1/1972 | Gibson . |
| 3,732,496 | 5/1973 | Boyer . |
| 4,665,560 | 5/1987 | Lange . |
| 4,691,173 | 9/1987 | Mollett et al. . |
| 4,852,123 | 7/1989 | Bickley et al. . |
| 5,193,223 | 3/1993 | Walczak et al. . |
| 5,287,555 | 2/1994 | Wilson et al. . |
| 5,301,364 | 4/1994 | Arens et al. . |
| 5,321,847 | 6/1994 | Johnson, Jr. . |
| 5,321,849 | 6/1994 | Lemson . |
| 5,507,022 | 4/1996 | Uomoto . |
| 5,524,285 | 6/1996 | Wray et al. . |
| 5,630,220 | 5/1997 | Yano . |
| 5,732,334 | 3/1998 | Miyake ............................ 455/127 |

FOREIGN PATENT DOCUMENTS

| | | |
|---|---|---|
| 0 688 108A2 | 12/1995 | European Pat. Off. . |
| 0648012A1 | 12/1995 | European Pat. Off. . |
| 92/2214 | 12/1992 | WIPO . |

*Primary Examiner*—Reinhard J. Eisenzopf
*Assistant Examiner*—Lester G. Kincaid
*Attorney, Agent, or Firm*—Robert E. Bushnell, Esq.

[57]     ABSTRACT

An output control unit of a mobile communication system includes a transmit up-converter board having first and second mixers responsive to first and second oscillation frequency signals, respectively, for up-converting the frequency of a transmission signal, an attenuator installed between the transmit up-converter board and a final output terminal for controlling output of the up-converted transmission signal order to eliminate unwanted signal characteristic irrespective of amplification and attenuation when the transmission signal is up-converted for transmission and a transceiver slave control unit responsive to the second oscillation frequency signal for generating a control signal for controlling the attenuator, wherein the transceiver slave control unit utilizes an interface unit controlled to produce phase locked loop control data for controlling a local oscillator to generate the second local oscillation frequency of a designated channel, wherein the local oscillator informs the interface unit that it is locked at the designated channel's frequency; a main processor unit for detecting that the local oscillator is tuned to the designated channel in response to an output from the interface unit indicating that the local oscillator is locked at the designated channel's frequency; a control memory for storing a control voltage conversion table of digital-to-analog conversion step values, wherein the main processor unit searches for an output attenuation value of the designated channel in a channel conversion table and accesses the control version conversion table to determine a digital-to-analog conversion step value corresponding to the output attenuation value of the designated channel; and a digital-to-analog converter for converting the digital-to-analog conversion step value transmitted from the main processor unit into the control signal for controlling the attenuator.

12 Claims, 8 Drawing Sheets

OUTPUT CONTROL UNIT OF MOBILE COMMUNICATION SYSTEM AND ITS CONTROLLING METHOD

CLAIM FOR PRIORITY

This application makes reference to, incorporates the same herein, and claims all benefits accruing under 35 U.S.C. §119 from an application for OUTPUT CONTROL UNIT OF MOBILE COMMUNICATION SYSTEM AND ITS CONTROLLING METHOD earlier filed in the Korean Industrial Property Office on May 31, 1996, and there duly assigned Ser. No. 19238/1996.

BACKGROUND OF THE INVENTION

1. Technical Field

The present invention relates to a mobile communication system comprising a plurality of communication units known as mobile stations and base stations, and more particularly, relates to an output control unit of a mobile communication system and its method for controlling an output characteristic of a transmit up-converter board.

2. Related Art

Modem mobile communication systems disclosed, for example, in U.S. Pat. No. 5,321,847 for Apparatus And Method For Detecting Intermodulation Distortion In A Radio Frequency Receiver issued to Johnson, Jr., and U.S. Pat. No. 5,524,285 for Radio Transmitter With Power Amplifier And Linarization issued to Wray et al., in which a plurality of communication units known as mobile stations and base stations communicate with each other over a wide band of frequencies within a single communication channel, are commonly known to include an upconverter to up-convert a frequency of a transmission signal and a downconverter to down-convert a frequency of a reception signal for communication purposes. Separate local oscillators for an upconverter are used to up-convert the frequency of a transmission signal at different stages of the uplink for transmission. Various automatic gain control circuitry such as disclosed in U.S. Pat. No. 4,665,560 for Wide Band Automatic Gain Control With Limiting Amplifiers issued to Lange, U.S. Pat. No. 5,301,364 for Method And Apparatus For Digital Automatic Gain Control In A Receiver issued to Arens et al., U.S. Pat. No. 5,321,849 for System For Controlling Signal Level At Both Ends Of A Transmission Link Based On A Detected Valve issued to Lemson, U.S. Pat. No. 5,630,220 for Automatic Gain Control Circuit For Radio Communication Apparatus issued to Yano, and output power control circuitry such as disclosed in U.S. Pat. No. 5,193,223 for Power Control Circuitry For A TDMA Radio Frequency Transmitter issued to Walczak et al., U.S. Pat. No. 5,287,555 for Power Control Circuitry For A TDMA Radio Frequency Transmitter issued to Wilson et al., are used to reduce saturation and noise.

Generally, an input signal for an upconverter or a downconverter is converted in two different stages using different local oscillators. The first stage requires the input signal to convert into a first intermediate frequency signal in a low frequency band which is then gain controlled and amplified for subsequent final conversion at the second stage using a relatively high local oscillation frequency. Such conversion arrangement has, as I have noted, resulted in unwarranted generation of undesirable signals due to the relatively high local oscillation frequency used. Moreover, temperature sensitivity, manufacturing variations and poor linearity of circuit components still attribute substantial degradation in performance.

SUMMARY OF THE INVENTION

Accordingly, it is therefore an object of the present invention to provide a digital mobile communication system using a transmit up-converter board (TUCB) for up-converting the frequency of a transmission signal and a down-converter reception board (DCRB) for down-converting the frequency of a reception signal.

It is also an object to provide an output control unit of a transmit up-converter board (TUCB) and a down-converter reception board (DCRB) for controlling gain of a final output signal and suppressing unwanted signals in a digital mobile communication system.

It is another object to provide an output control unit of a transmit up-converter board (TUCB) for controlling gain of a final output signal using a voltage control.

These and other objects of the present invention can be achieved by an output control unit of a digital mobile communication system which includes a transmit up-converter board having a first mixer for up-converting an input transmission signal into a first intermediate frequency signal using a first local oscillation frequency signal and a second mixer for up-converting the first intermediate frequency signal into an output transnission signal using a second local oscillation frequency signal; and an attenuator installed between the transmit up-converter board and a final output terminal for controlling magnitude of the output transmission signal which has been up-converted to suppress unwanted signal characteristic irrespective of amplification and attenuation when the input transmission signal is up-converted.

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
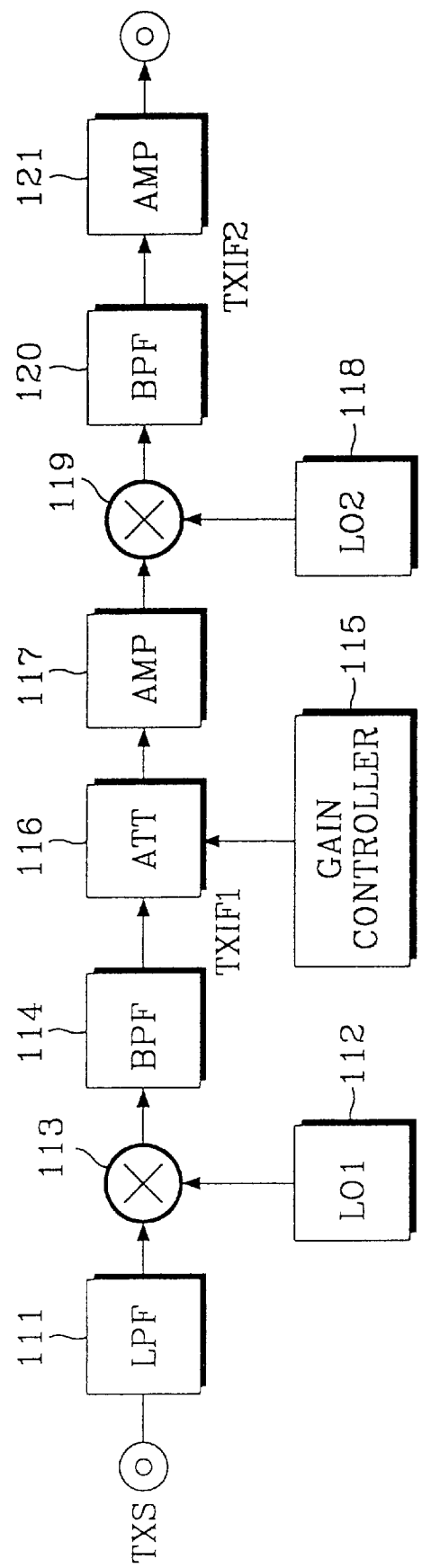
FIG. 1 is a detailed block diagram of an exemplary device for controlling an output of a transmit up-converter board (TUCB) and a down-converter receiver board (DCRB) in a mobile communication system.

Referring now to the drawings and particularly to FIG. 1, which illustrates an exemplary device for controlling a transmit up-converter board (TUCB) and a down-converter receiver board (DCRB) in a mobile communication system. Referring to FIG. 1, a transmission signal TXS is fed to a low-pass filter (LPF) 111 which filters unnecessary high frequency component of the transmission signal above a predetermined frequency band. The transmission signal, passed through the LPF 111, is input to a first mixer 113 to be mixed with a first local oscillation signal, which is generated by a first local oscillator LO1, so that it is frequency converted into a first up-conversion frequency signal TXIMF1 via a first band-pass filter (BPF) 114.

A gain controller 115 then generates a gain control signal to control the output of the first band-pass filter (BPF) 114. An attenuator 116, which is connected to the output of the first band-pass filter (BPF) 114, attenuates the output gain of the first up-conversion frequency TXIF1 in accordance with the gain control signal generated by the gain controller 115. The attenuator 116 typically employs a pin diode.

An amplifier 117 then receives the output of the attenuator 117 and amplifies the first up-conversion frequency TXIF1 which was attenuated by the attenuator 117. A second local oscillator (LO2) 118 generates a second local oscillation frequency LO2 for a second frequency conversion of the first up-conversion frequency TXIF1. A mixer 119 combines the first up-conversion frequency TXIF1 and the second local oscillation LO2 to produce a second up-conversion frequency signal through a second band-pass filter (BPF) 120 which filters unnecessary frequency component of the mixed signal. An amplifier 121 connected to the output of the second band-pass filter (BPF) 120 then amplifies the second up-conversion frequency TXIF2.

The output of the transmit up-converter board (TUCB) as described is generally gain controlled in a middle frequency band. If an input signal transmitted to a final mixer 119 is so low, a relatively high local oscillation frequency signal generated from the second local oscillator (LO2) 118 may cause the final mixer 119 to generate an unwanted signal. When an unwanted signal is generated due to the relatively high local oscillation frequency LO2, significant degradation in the system's performance occurs because final amplification is always required for transmission. Moreover, since the attenuator (ATT) 116 using a pin diode is sensitive to temperature or pressure, precise control of a final output signal is difficult to attain. Furthermore, complex circuits with higher precision may not be constructed because the device using a current control technique.

Figure 2:
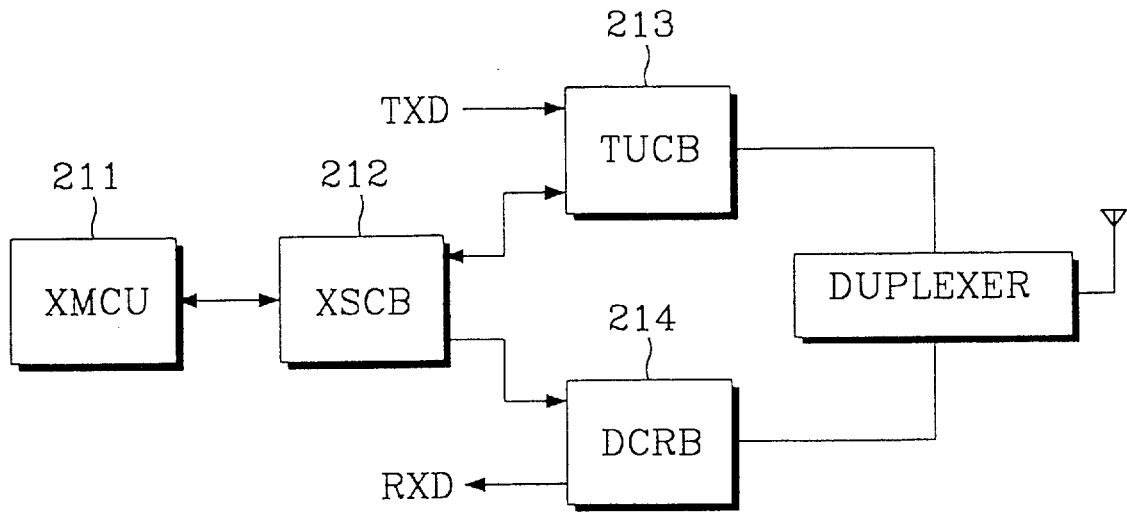
FIG. 2 is a schematic block diagram of a mobile communication unit comprising a transmit up-converter board (TUCB) and a down-converter receiver board (DCRB) in a digital mobile communication system for use according to the principles of the present invention.

Turning now to FIG. 2 which illustrates a mobile communication unit comprising a transmit up-converter board (TUCB) 213 and a down-converter receiver board (DCRB) 214 in a digital mobile communication system for use according to the principles of the present invention. The digital mobile communication system intended in a preferred embodiment of the present invention is a code division multiple access (CDMA) cellular telephone system, although the other digital cellular telephone system employing different transmission schemes such as time-division multiple-access (TDMA) may also be utilized. As shown in FIG. 2, a transceiver unit comprises a transceiver master control unit (XMCU) 211, a transceiver slave control unit (XSCB) 212, a transmit up-converter board (TUCB) 213, and a down-converter receiver board (DCRB) 214. The XSCB 212 controls the operations of the TUCB and DCRB 213 and 214 of a module concerned. The XMCU 211 controls those of a multitude of the XSCBs 212.

The XSCB 212 is actually installed in the transceiver unit to control the gain of the TUCB 213 and the local oscillator frequency so as to determine a channel frequency. The XSCB 212 detects periodically an intermediate frequency signal received from the DCRB 214, and transmits its output to the XMCU 211 in order to control the gain of the DCRB 214. The XSCB 212 also collects state data from each board and displays the same on an internal display. The XSCB 212 transmits its output to the XMCU 211. The XSCB 212 is in data communication with the XMCU 211 and external units using a plurality of series data ports contained therein.

Figure 3:
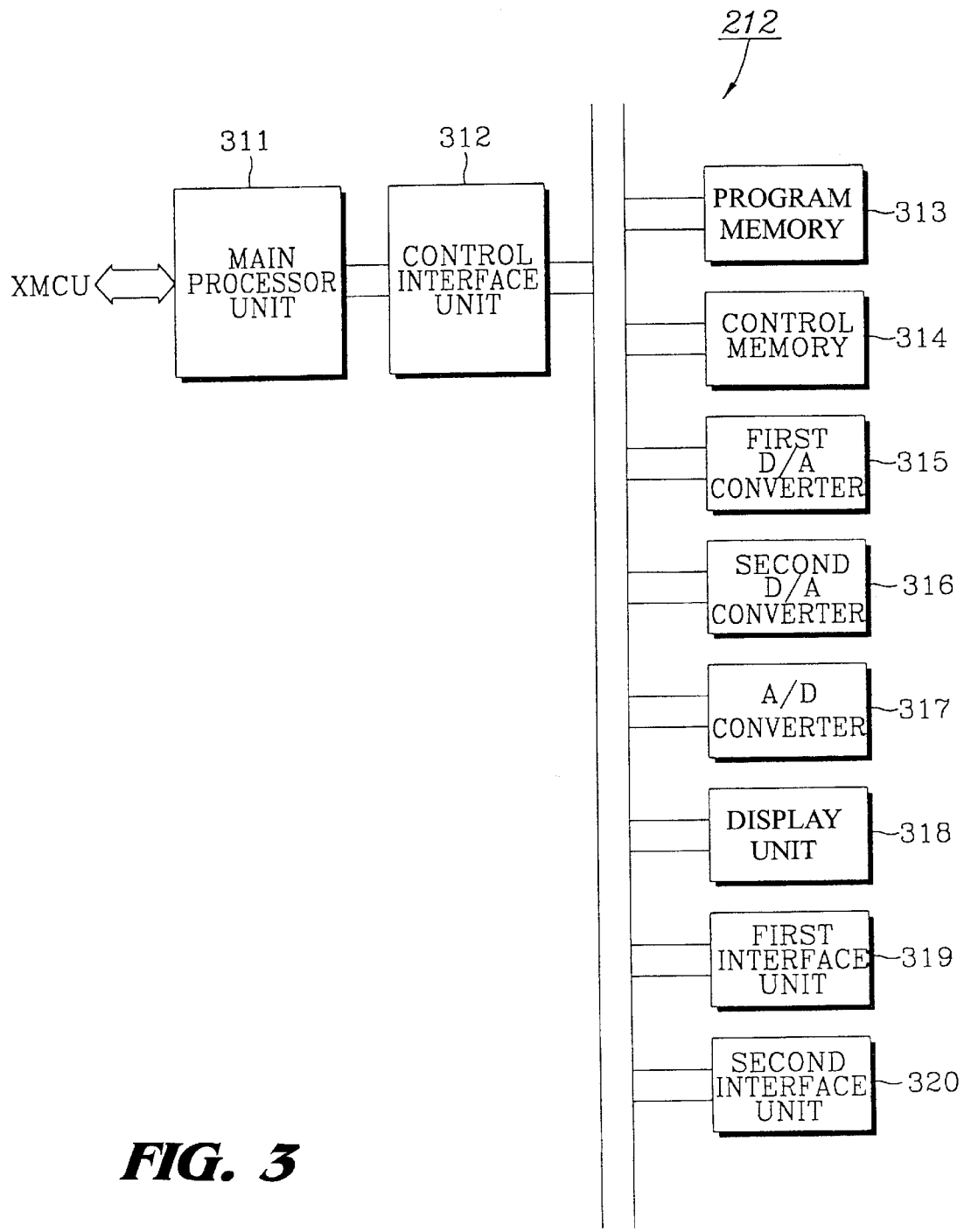
FIG. 3 is a detailed block diagram of a transceiver slave control unit (XSCB) as shown in FIG. 2.

FIG. 3 illustrates a detailed block diagram of the XSCB 212 as shown in FIG. 2. The XSCB 212 includes a main processor unit 311 which comprises ports that are in data communication with the XMCU 211 and external PCs in order to control overall operation of the XSCB 212. The main processor unit 311 may use a model unit MC68302. A control interface unit 312, which is connected between the main processor unit 311 and a bus, interfaces data on the main processor unit 311 and the bus. The control interface unit 312 may comprise an address latch and a data buffer. A program memory 313 including a booter and a debug has a first memory which is an EPROM to operate an application program stored therein, and a second memory which is a SRAM to down-load the XSCB's O/S and application programs from the XMCU 211. A control memory 314 stores control values to control the output of the TUCB 213 and DCRB 214. The control interface unit 312 stores control values to control the output gain of the signal transmitted according to the output characteristic of the TUCB 213. The control interface unit 312 may use an EEPROM.

A first digital-to-analog (D/A) converter 315 converts the control value to control the output gain of the TUCB 213 into an analog signal under the control of the main processor unit 311. A second digital-to-analog (D/A) converter 316 converts the control value to control the output gain of the DCRB 214 under the control of the main processor unit 311. The first and second D/A converters 315 and 316 employ 12-bit converters. The output voltage is designed in the range of 0 V and 5 V and can be controlled by step values 0–4095. The output voltage is given by (5 V/4096)×step value. An analog-to-digital (A/D) converter 317 receives a signal such as a receive signal strength indicator (RSSI) level transmitted from the DCRB 214, and converts the same signal into digital data for transmission to the bus.

A display unit 318 which is in communication with the control interface unit 312 is used to display the frequency channel state of the transceiver unit. A first interface unit 319 controls the PLL-related signals of the TUCB 213 and the on/off signal of the transmit output signal. A second interface unit 320 controls the gain control on/off signal of the DCRB 214.

Figure 4:
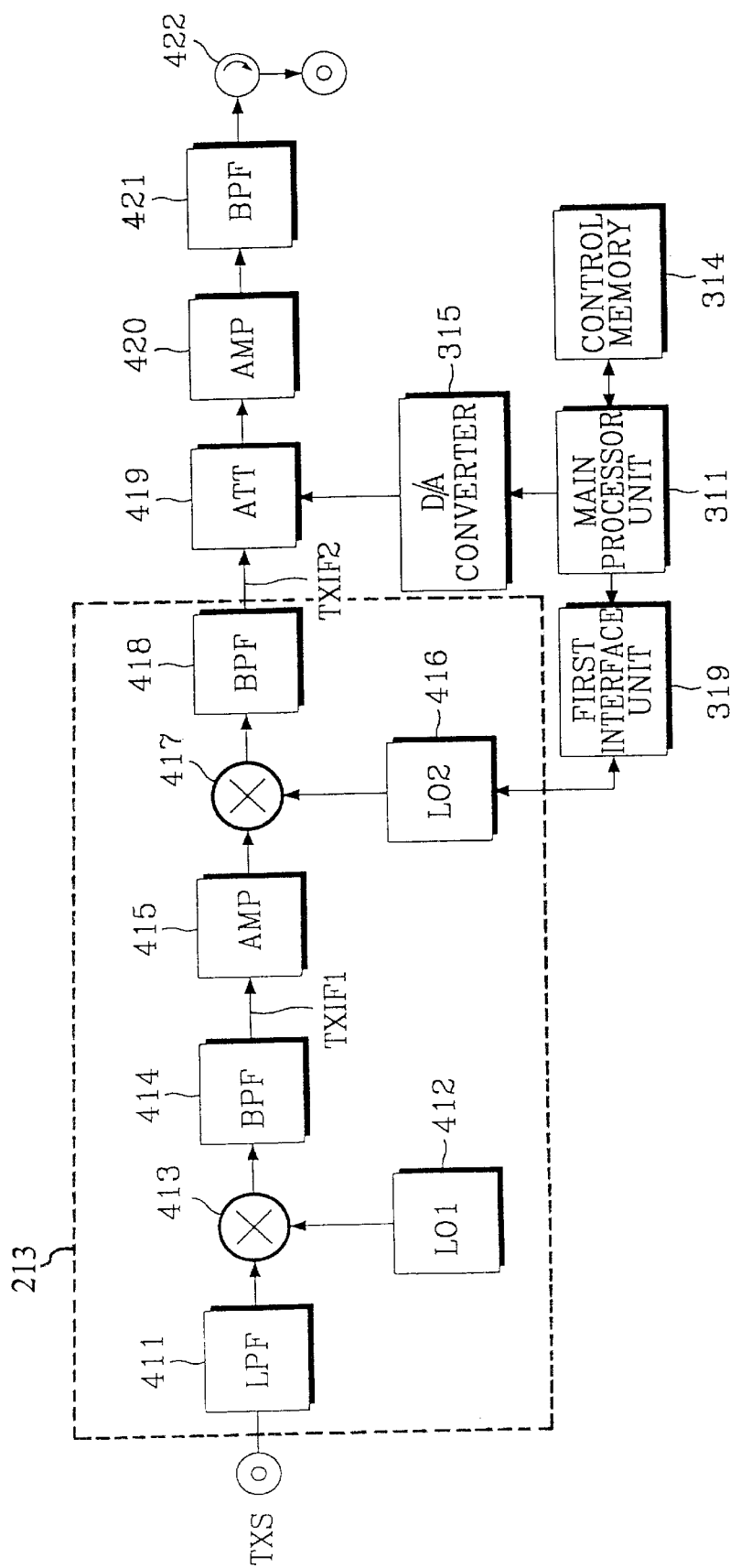
FIG. 4 is a detailed block diagram of a novel device for controlling an output of a transmit up-converter board (TUCB) and a down-converter receiver board (DCRB) according to a preferred embodiment of the present invention.

FIG. 4 is an operational diagram of a novel device for controlling a final output signal of the TUCB 213 and DCRB 214 in accordance with a preferred embodiment of the present invention. The TUCB 213 receives a transmission signal TXS of 4.95 MHz from a sector interface card (SIC) (not shown) and converts the same into frequencies in a UHF band between 369 and 894 MHz.

Referring to FIG. 4, the transmission signal TXS is fed to a low-pass filter (LPF) 411 which filters alternating currents of the transmission signal below a predetermined frequency band and substantially attenuates all other currents. A first local oscillator (LO1) 412 generates a first local oscillation frequency LO1 for a first frequency conversion of the transmission signal TXS. The first local oscillation frequency LO1 may be 110.04 MHz. A first mixer 413 combines the transmission signal TXS and the first local oscillation frequency signal LO1 to produce sum and difference signals between the transmission and local frequencies TXS and LO1, where the sum signal is 114.99 MHz and the difference signal is 105.09 MHz. A first band-pass filter (BPF) 414 band-pass filters the sum signal in a 115 MHz band from the combined signals of the first mixer 413, giving a first up-conversion for the sum signal filtered. The sum signal filtered by the first BPF 414 is a first up-conversion frequency TXIF1. An amplifier 415 amplifies the first up-conversion frequency TXIF1 from the first BPF 414 by using dielectric and SAW filters. A second local oscillator (LO2) 416 generates a second local oscillation frequency LO2 for a second frequency conversion of the first up-conversion frequency TXIF1. The second local oscillation frequency LO2 is in the UHF band between 754 and 779 MHz for use to determine a transmission channel by the channel control data transmitted from the XSCB 212. A second mixer 417 combines the first up-conversion and second local frequencies TXIF1 and LO2 to produce sum and difference signals between the first up-conversion and second local frequencies TXIF1 and LO2, where the sum signal is 869 MHz–894 MHz and the difference signal is 649 MHz–664 MHz. A second band-pass filter (BPF) 418 band-pass filters the sum signal (869 MHz–894 MHz) from the combined signals of the second mixer 417 for a second up-conversion for the sum signal filtered. The second BPF uses dielectric and SAW filters. The sum signal filtered by the second BPF 418 is a second up-conversion frequency TXIF2.

The control memory 314 comprises tables for storing control data to compensate for the output characteristic of the TUCB 213. The main processor unit 311 accesses the output control data of a channel concerned in the control memory 314. The D/A converter 315 converts the control data of the main processor unit 311 into analog control voltages. An attenuator 419 is connected to the output terminal of the second BPF 418 for attenuating the output gain of the second up-conversion frequency TXIF2 by means of the gain control voltage generated by the D/A converter 315. According to the present invention, the attenuator 419 is composed of two MMICs in series and is controlled by the D/A converter 315. An amplifier 420 connected to the output terminal of the attenuator 419 amplifies the second up-conversion frequency TXIF2.

As described above, the device constructed according to the present invention can inhibit unwanted signals which may result from the second local frequency LO2 and effectively control the gain of a final output signal which has been up-converted. This means that the unwanted signal in the second local frequency LO2 can be attenuated for two times at the output terminal of the second mixer 417 and at the front end of the final output terminal. Furthermore, gain control is easily attained because the main processor unit 311 uses a voltage control method.

A third BPF 421 which may be a dielectric filter, receives the second up-conversion frequency TXIF2 from the amplifier 420 and band-pass filters the same in a designated transmit frequency band. An isolator 422 receives the output of the third BPF 421, and isolates the same from the output signal (869 MHz–894 MHz) at the output terminal of the TUCB 213. With the isolation 422, it is possible to improve the isolation between multi-channels in a CDMA digital mobile communication system and suppress unwanted signals in advance.

To control the output of the TUCB 213 by the device as shown in FIG. 4, measurement must be made on the output attenuation control data and the step value of the first D/A converter 315 which depends on the output attenuation control data. The results are stored in the control memory 314 as data to control the gain. Prior to the measurement, the output attenuation characteristic according to the step conversion of the first D/A converter 315 at a reference channel of the TUCB 213 must be determined. The determined result is stored in a table contained in the control memory 314 (hereinafter, referred to as "control voltage conversion table"). The gains of the channels concerned are determined by a comparison with that of a reference channel, as the channels are changed sequentially at the maximum D/A conversion step. The gain values obtained are stored in another table contained in the control memory 314 (hereinafter, referred to as "channel conversion table").

Figure 5:
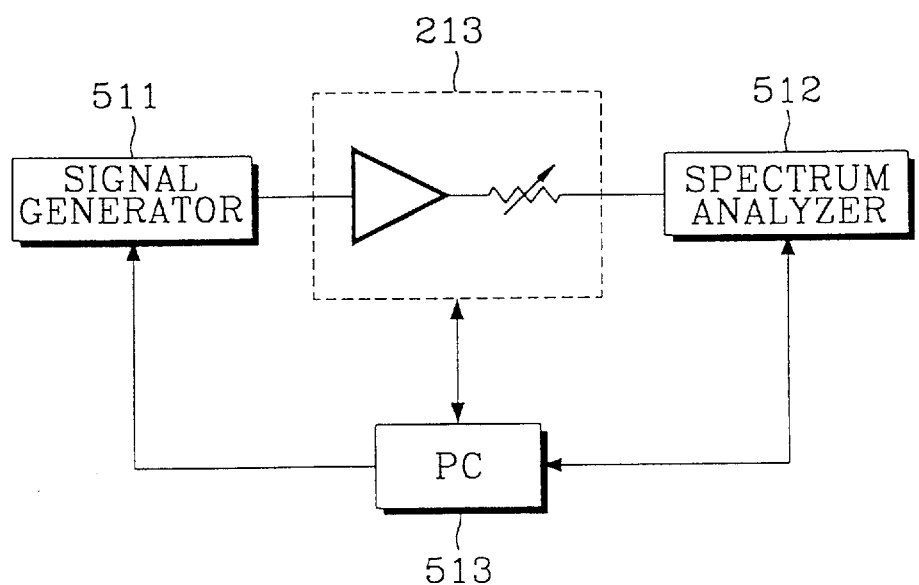
FIG. 5 is a block diagram of a device for calibrating an output attenuation characteristic of a transmit up-converter board (TUCB) according to the present invention.

FIG. 5 illustrates a device for measuring the output attenuation characteristic of the TUCB 213. A signal generator 511 produces a test signal to measure the output attenuation characteristic of the TUCB 213. The test signal and the gain control signal of an external PC 513 are provided to the TUCB 213. The output can be adjusted by dB, as a TX attenuation value varies by dB unit at the TUCB 213 and the final output of a final output antenna is monitored. The equation for determining a gain control is provided hereinbelow, $$\text{Gain}=\text{TXL}-G_{LPA}-S_0-\text{Loss}[\text{dB}],$$

where TXL is the output level transmitted from the system, $G_{LPA}$ represents the gain of the output amplifier from PC 513, $S_0$ the output level of the signal generator 511, and Loss represents the total loss related to a transmission path.

When measuring the output characteristic of the TUCB 213 by utilizing the device as shown in FIG. 5, a reference channel is first set. Through the reference channel, calibration is made on the correlation between the control voltage and the gain. After 0dBm is transmitted to the TUCB 213, the control voltage is changed with the step value of the first D/A converter 315 varying in the range of 0 to 4095. The gain value of the TUCB 213 is measured and stored. The frequency measured can be obtained in a special frequency band and it becomes the reference channel's frequency. The present invention is attained under the assumption that the system includes a 486 channel (CH No 486, 884.58 MHz). The step control value of the first D/A converter 315 is sequentially varied by 10 unit, thereby changing the control voltage. The output attenuation characteristic data is measured depending on the change of the control voltage that is applied to the attenuator 419. The data is stored in the table of the control memory 314, which is referred to as the "control voltage conversion table" according to the present invention.

After the output attenuation characteristic is measured depending on the changes of the reference channel's control voltage, a second calibration of the characteristic is made as against the changes of a channel frequency. The output attenuation characteristic is determined at each channel concerned by generating a designated control voltage and changing the channel frequency at every three channels. The results are compared with the reference channel's value so as to measure the variations of the gain, the reference channel in the present invention is a 486 channel. The calibrated output attenuation characteristics at every channels are stored in the table of the control memory 314, which is referred to as the "channel conversion table" according to the present invention.

Figure 6:
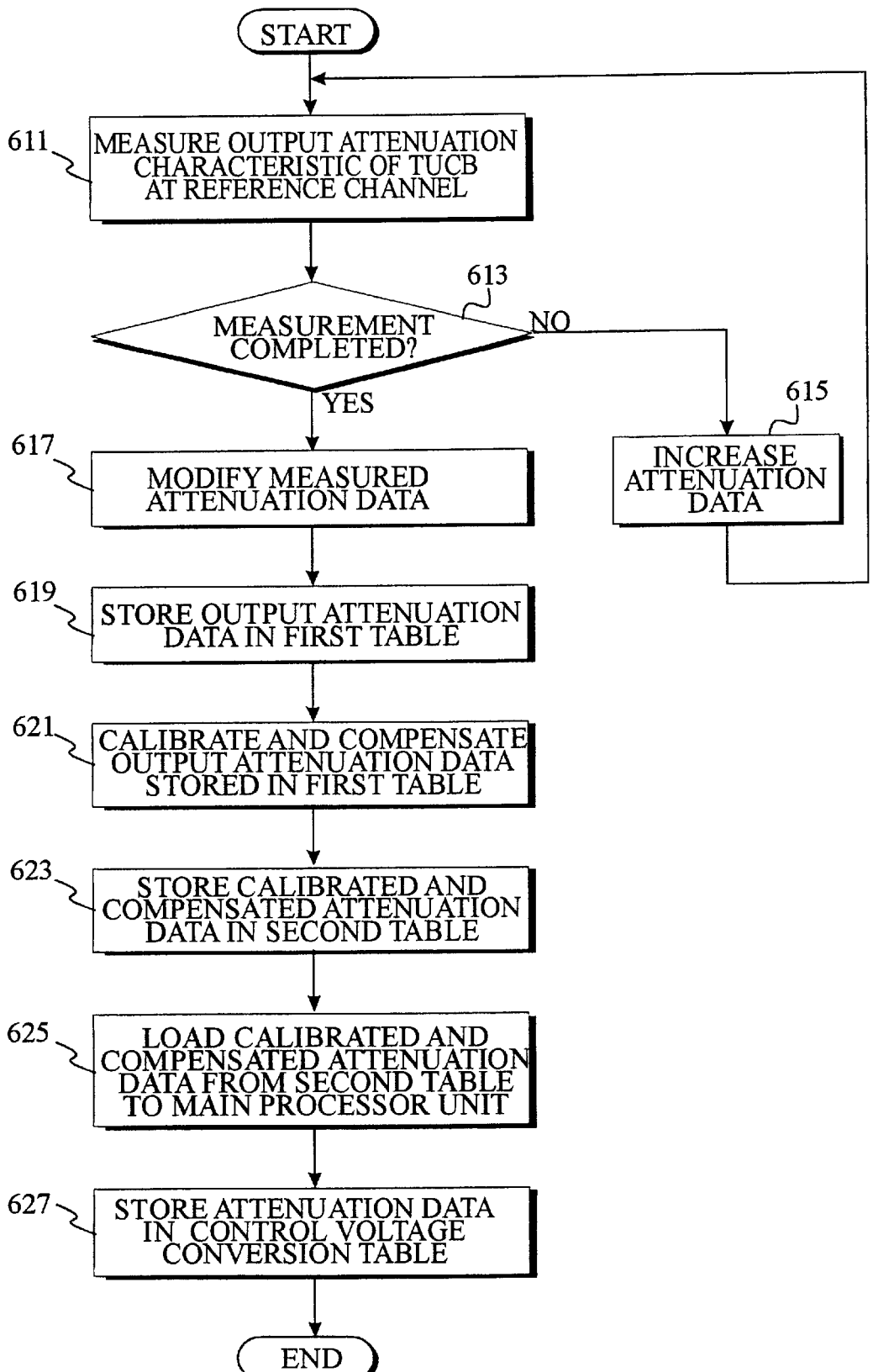
FIG. 6 is a flow chart of a process of measuring a TX attenuation level at a reference channel of the transmit up-converter board (TUCB) according to the present invention.

FIG. 6 illustrates a process of measuring the output characteristic depending on the control voltage at the reference channel. To measure the output characteristic of the TUCB 213, after setting a reference channel, the output of the TUCB 213 is measured by the spectrum analyzer 515 as shown in FIG. 5 as the control voltage changes at step 611. As for the conditions of the measurement, the signal transmitted to the TUCB 213 is set to 0 dBm, the reference channel is a 486 channel, and the step changes in the range of 4090–10 (10/step). Under these conditions, the control voltage is decreased by 10 steps and the output attenuation data related are stored. The spectrum analyzer 515 measures the output attenuation characteristic depending on the variations of the control voltage and stores the results therein, repeatedly in steps 611 through 615.

After the measurement is completed, the results are modified depending on the characteristic of the spectrum analyzer 515 at step 617. When the values measured distribute by 0.1 dB unit, the values remain unchanged. For example, the values distribute by 0.17 dB when the spectrum analyzer 515 is HP8563, and the data is modified as illustrated in the below table.

TABLE 1

| VALUES MEASURED | RESULTS |
|---|---|
| 0.0 dB | 0.0 dB |
| 0.17 dB | 0.20 dB |
| 0.33 dB | 0.30 dB |
| 0.50 dB | 0.50 dB |
| 0.67 dB | 0.70 dB |
| 0.83 dB | 0.80 dB |

After the data modification, the output attenuation values are stored depending on the conversion step values in a first table as shown in table 2.

TABLE 2

| | TABLE-1 | TABLE-2 | REF. |
|---|---|---|---|
| RANGE | −80.0 ▶ 0.0 dB | 0.0 ▶ + 10.0 dB | |
| SIZE OF TABLE | 1602 BYTES | 202 BYTES | |
| SIZE OF DATA | 2 BYTES | 2 BYTES | EXISTING FORMAT |
| DATA CONTENTS | 800 ▶ 0 | 1000 ▶ 1100 | 0.1 dB/STEP |

After the first table is completed, calibration and compensation are performed for the data stored in the first table at step 621. A ripple component in the data measured is removed and the data measured is stored in the table 2. The removal of the ripple is classified with a standard of the output attenuation level −60 dBm. A compensation of the data is accomplished by decreasing the output attenuation value from 4090 to 10. When the output attenuation level is more than −60 dBm, the smallest value of the output attenuation is selected.

Figure 7A:
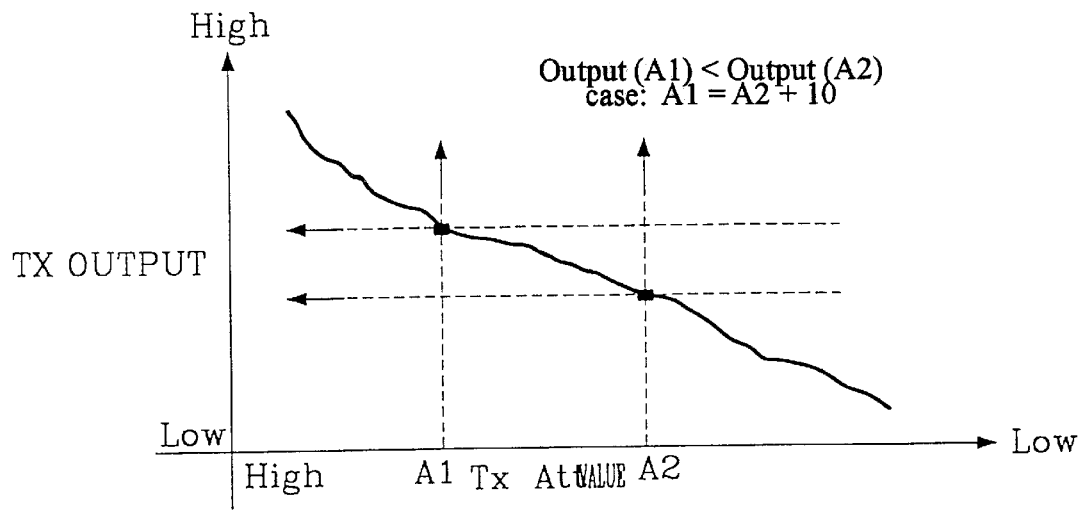
FIGS. 7A through 7D are graphical diagrams of the relative characteristics of TX attenuation level of the transmit up-converter board (TUCB)
Figure 7B:
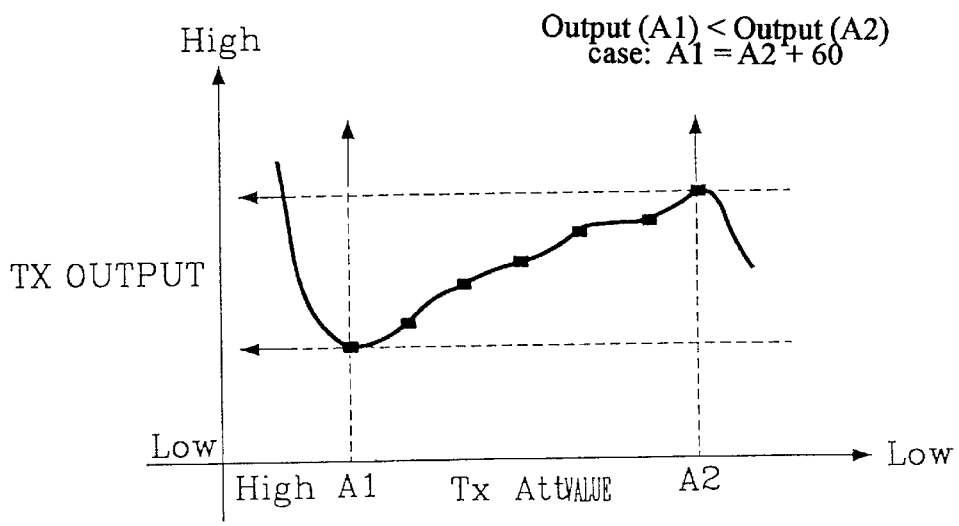
Figure 7C:
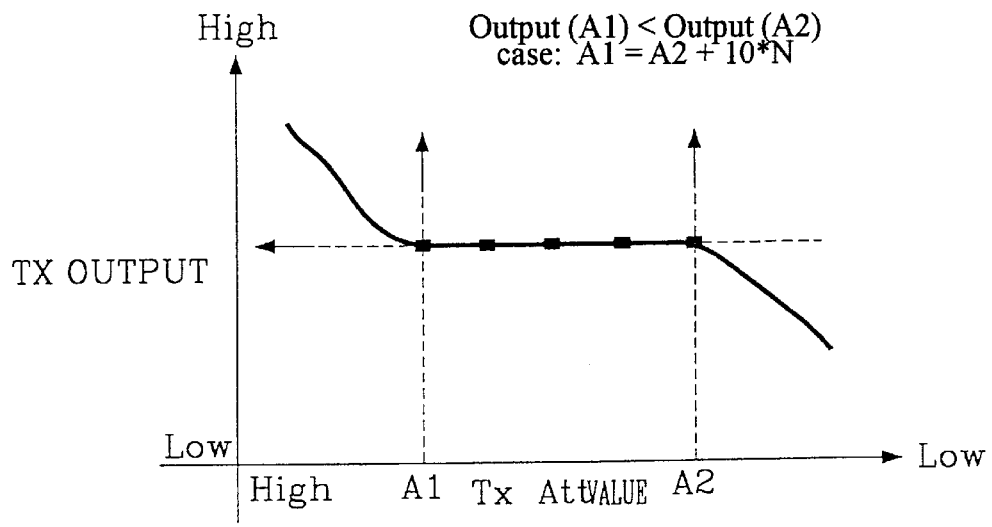
Figure 7D:
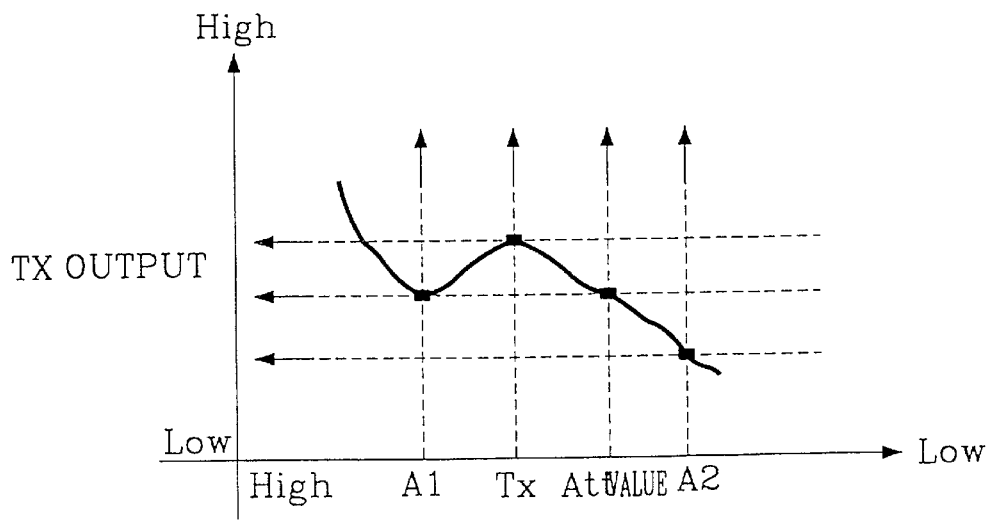

If the output attenuation level is less than −60 dBm, the output attenuation value is determined by a method as shown in FIGS. 7A through 7D. It is determined to be normal when the measured value decreases as shown in FIG. 7A (A1>A2). When the value measured increases even with at least six times' successive decrease of the output attenuation value as shown in FIG. 7B (A1<A2), the TUCB 213 or XSCB 212 is determined to be a failure. The measuring error is permitted up to 1 dB (6×0.17 dB). If the measured value is constant as shown in FIG. 7C (A1=A2), the attenuation value becomes N/2+1, where N is the number of times that a same attenuation value is obtained. Referring to FIG. 7D, when small output attenuation values are detected in succession for less than five times, or large values are obtained, the above three cases are adopted (A1>A2, A1=A2, A1<A2).

To complete a second table, in step 623, the calibrated data that have been stored in the first table are modified into the range of 0–800 and 900–910, and compensated for the output attenuation value by 0.1 dB unit. When the second table is completed, information of the output attenuation characteristic depending to the variations of the control voltage in the second table are loaded on the XSCU 212 at step 625. The XSCU 212 stores the information in the control voltage conversion table of the control memory 314 at step 627.

The control voltage conversion table stores the changes of the gains depending on the D/A conversion step changes (0–4095) at the reference channel, as shown in table 3.

TABLE 3

| TX-ATT (GAIN) | D/A CONVERSION STEP |
|---|---|
| 0 | 0 |
| 10 | 50 |
| 20 | 100 |
| — | — |
| — | — |
| — | — |
| 910 | 4000 |
| 920 | 4050 |
| 930 | 4095 |

The control voltage conversion table stores the variations of the output attenuation gain of the TUCB 213 which is measured according to the D/A conversion steps (that is, the control voltages) changing at the reference channel (CH 486). As shown in Table 3, the control value is in the range of 0–930, the attenuation control values are 0–800, and the gain control values 900–930. The output during an attenuation control is given by "(attenuation control value)/10=attenuation". For example, when the attenuation control values are 100, 250 and 800, the attenuation values are 10 dB, 25 dB and 80 dB, respectively. The output during a gain control is given by "(gain control value−900)/10=gain". For example, when the gain control values are 910, 915 and 920, the gain values are 1.0 dB, 1.5 dB and 2.0 dB, respectively. As a result, the XSCB 212 stores the control voltage conversion table in the control memory 314 which is under the control of the main processor unit 311. The control voltage corresponding to the conversion step of the first D/A converter 315 are given by "control voltage=(5 V/4095)× control step value", the first D/A converter 315 is controlled by the main processor unit 311 are obtained by a method of measuring the output attenuation characteristic depending on the changes of channels as shown in FIG. 8.

Figure 8:
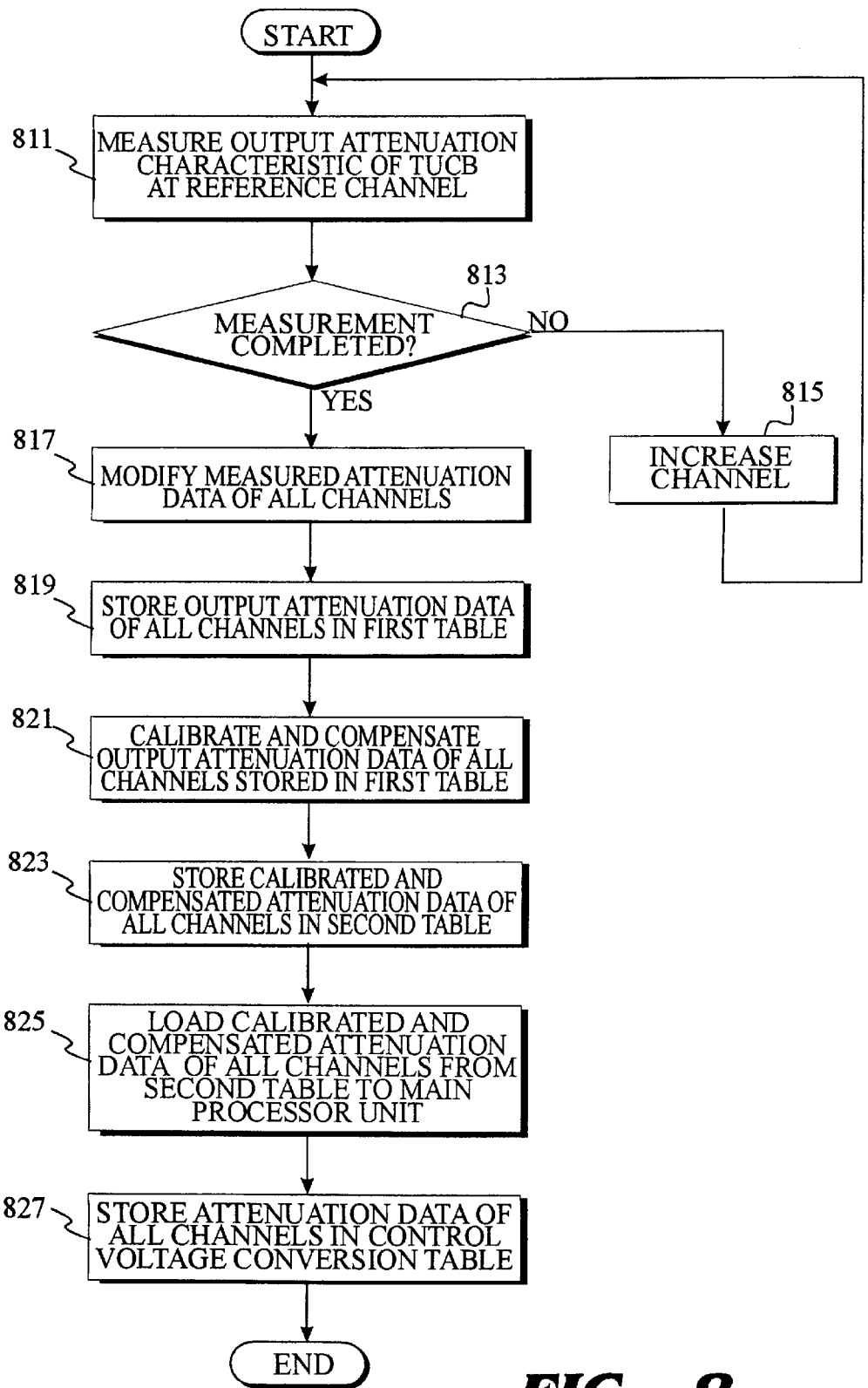
FIG. 8 is a flow chart of a process of measuring the calibrated TX attenuation level at each channel by comparing the TX attenuation level of a reference channel with that of a designated channel according to the present invention.

Refer to FIG. 8, the measurement is attained by supplying control voltages to the attenuator 419 and controlling the frequency generator 416 in order to change the channel frequencies. The spectrum analyzer 515 transmits PLL data to the frequency generator 416 so as to generate a channel frequency to be measured at step 811. A designated control voltage is generated at the attenuator 419 so that the output attenuation characteristic of the channel is measured. The measurement is carried out repeatedly three times by three channels with the signal transmitted to the TUCB 213 set to 0 dBm. A channel measured is given by (3×the sequence number for measurement−1) in the range of 1–799 and 990–1023. For example, the measuring channel is 2, 5, 8, , 799, 991, 994, , 1022 in sequence. When at least two of three are identical to each other, the data is selected as a data measured. If there is no data identical to each other out of three, the average value is considered as a data measured. The spectrum analyzer 515 measures the output attenuation characteristic depending on the variations of the channel and stores the results, repeatedly in steps 811 through 815.

When the measurements of the output attenuation characteristic depending on the variation of the channel are completed, the data measured is modified by changing the data according to the characteristic of the spectrum analyzer 515 at step 817. If the data is distributed by 0.1 dB, the data remains unchanged. For example, the value varies by 0.17 dB when the spectrum analyzer 515 is a HP8563, the data is modified as shown in table 1.

A first table is then made from the measuring data by all channels by means of the data measured and modified as described at step 819. After the first table is completed, calibration and compensation are performed for the data in the first table at step 821. When the difference between the values measured at channels is in excess of 0.7 dB, it is considered as a measuring error or a failure of the TUCB 213. The earliest channel for the calibration is CH 990.

After the calibration and compensation of the data measured, a second table is made at step 823. When completing the second table, the calibrated data converts the off-set values based on the number of the reference channel (486) by 0.1 dB unit. The data is increased or decreased by 1 from 0.1 dB in the range of −12.7 dB +12.7 dB. The following is an example of the off-set.

| MEASURING VALUE | OFF-SET DATA |
| --- | --- |
| −1.0 dB | −10 |
| −0.6 dB | −6 |
| +0.3 dB | +3 |
| +2.3 dB | +23 |

When the second table is completed, information of the output attenuation characteristic depending on the changes of the control voltage in the second table are loaded on the XSCU 212, in step 825. The XSCU 212 stores the information in the control voltage conversion table of the control memory 314 at step 827.

The channel conversion table in the control memory 314 stores the gain deviations between channels according to the changes of the channels at the maximum D/A conversion step (4095). As the reference channel is a 486 channel, the gain deviations are obtained as shown in table 4 by comparing the gain measured from the maximum D/A step value at the reference channel with those measured from the maximum D/A step values at respective channels.

TABLE 4

| FREQUENCY CHANNEL | TX-ATT (GAIN) |
| --- | --- |
| 1 | 925 |
| 2 | 925 |
| 3 | 925 |
| — | — |
| — | — |
| — | — |
| 485 | 920 |
| 486 | 925 |
| 487 | 930 |
| — | — |
| — | — |
| 798 | 920 |
| 799 | 920 |
| 990 | 925 |
| — | — |
| 1023 | 920 |

Table 4 shows that the channel conversion table stores the relative gains of channels compared with the reference channel (CH 486).

The output control is described with reference to the control voltage conversion table and the channel conversion table in Table 3 and Table 4, respectively.

In a digital mobile communication system, the output control is a major factor of determining a cell coverage by controlling the output of a base station. It is accomplished under the supervision of a base station manager which controls the base station of the system. The data transmission path is the base station manager, a call control processor, a base station controller, and a transceiver interface processor, in turn. The transceiver interface processor may be the TUCB 213 and XSCB 212.

When transmitting a transmission signal at the XSCB 212, the first interface unit 319 is controlled to produce PLL control data and generate the second local oscillation frequency LO2 of a designated channel. The frequency generator 416 informs the first interface unit 319 that it is locked at the channel's frequency. The main processor unit 311 detects that the local oscillator 416 is tuned in the designated channel by the output of the first interface unit 416. The main processor unit 311 also accesses the table stored in the control memory 314 and searches for the output attenuation value TX-ATT of the designated channel in the channel conversion table as shown in Table 4. The main processor unit 311 searches for the D/A conversion step value corresponding to the output attenuation value TX-ATT in the control voltage conversion table as shown in Table 3. The D/A converter 315 converts the step value transmitted from the main processor unit 311 and transmits the same to the attenuator 419. The attenuation control voltage generated by the D/A converter 315 is given by (5 V/4096)×step value.

The transmission signal TXS transmitted with the TUCB 213's channel and output control is converted into the first up-conversion frequency TXIF1 by the mixer 413 and into the second up-conversion frequency TXIF2 of the designated channel by the mixer 417. The transmission signal has been up-converted for two times as above. It is optimally gained or attenuated according to the result of the measurement by the attenuator 419. The attenuator 419 has the control voltage that provides the highest output efficiency at a designated channel so that it can control the gain or attenuation value in order to provide an efficient output of the second up-conversion frequency TXIF2.

The transmission signal of the attenuator 419 is transmitted through an antenna via the isolator 422. The isolator 422 has different transmit frequencies and separates them from those of another multi-channel digital mobile communication system with high performance amplifiers. Thus the present invention inhibits unwanted signals that may be caused by the other transmit frequencies. Because attenuator 419 is located between the mixer 417 generating the second up-conversion frequency and the final output terminal, it can suppress unwanted signals which may relatively result from the high frequencies of the frequency generator 416.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof Therefore, it is intended that the present invention not be limited to the particular embodiment disclosed as the best mode contemplated for carrying out the present invention, but that the present invention includes all embodiments falling within the scope of the appended claims.

What is claimed is:

1. An output control unit of a digital mobile communication system, comprising:
    a transmit up-converter board having a first mixer for up-converting an input transmission signal into a first intermediate frequency signal in response to a first local oscillation frequency signal, and having a second mixer for up-converting the first intermediate frequency signal into an output transmission signal in response to a second local oscillation frequency signal;
    an attenuator installed between the transmit up-converter board and a final output terminal, for controlling the magnitude of the output transmission signal, which has been up-converted, to suppress an unwanted signal characteristic irrespective of amplification and attenuation when the input transmission signal is up-converted; and
    a transceiver slave control unit responsive to said second oscillation frequency signal for generating a control signal for controlling said attenuator.

2. The output control unit of claim 1, further comprising an isolator installed between the attenuation and the final output terminal for suppressing additional unwanted signals caused by interaction with other transmission signals.

3. The output control unit of claim 1, wherein said transceiver slave control unit comprises:
    an interface unit controlled to produce phase locked loop control data for controlling a local oscillator to generate the second local oscillation frequency of a designated channel, wherein said local oscillator informs said interface unit that it is locked at the designated channel's frequency;
    a main processor unit for detecting that the local oscillator is tuned to the designated channel in response to an output from said interface unit indicating that said local oscillator is locked at the designated channel's frequency;
    a control memory for storing a control voltage conversion table of digital-to-analog conversion step values, wherein said main processor unit searches for an output attenuation value of the designated channel in a channel conversion table and accesses the control version conversion table to determine a digital-to-analog conversion step value corresponding to the output attenuation value of the designated channel; and
    a digital-to-analog converter for converting the digital-to-analog conversion step value transmitted from the main processor unit into said control signal for controlling said attenuator.

4. An output control unit of a digital mobile communication system, comprising:
    a transmit up-converter board for up-converting in frequency an input transmission signal using a local frequency to generate an up-converted transmission signal;
    an attenuator located between the transmit up converter board and a final output terminal, for controlling a magnitude output of said up-converted transmission signal according to a control voltage applied;
    a memory for storing output control data of the up-converted transmission signal; and
    a main processor unit for transmitting channel assignment data so as to generate the local frequency of a transmission channel assigned during a transmission mode, accessing the output control data of the transmission channel assigned in the memory, converting accessed output control data of the transmission channel assigned into the control voltage, and applying the control voltage to the attenuator for controlling the magnitude output of the up-converted transmission signal.

5. The output control unit of claim 4, further comprising:
    a channel conversion table for storing output attenuation data of transmission channels;
    a control voltage conversion table for storing step data corresponding to the output attenuation data;
    a converter connected to the attenuator for generating the control voltage depending on the step data; and
    when the transmission channel is assigned, the main processor unit searching for output step data of the transmission channel stored in the channel conversion table, accessing the step data corresponding to the attenuation data stored in the control voltage conversion table, and applying the step data to the converter.

6. The output control unit of claim 5, said transmit up-converter board comprising:
    a first frequency generator for generating said local frequency;
    a second frequency generator for generating another local frequency;
    a first mixer for combining said local frequency and the input transmission signal;
    a first band-pass filter for band-pass filtering an output of the first mixer to generate a first up-conversion frequency;
    a second mixer for combining the first up-conversion frequency and said another local frequency; and
    a second band-pass filter connected to the attenuator for band-pass filtering an output of the second mixer to generate a second up-conversion frequency as said up-converted transmission signal.

7. The output control unit of claim 6, further comprising an isolator installed between the attenuation and the final output terminal for suppressing additional unwanted signals caused by interaction with other transmission signals.

8. An output control unit of a digital mobile communication system, comprising:
    an input terminal coupled to receive an input transmission signal;

a first filter for eliminating unnecessary frequency components of said input transmission signal to produce a first filtered signal;

a first local oscillator for generating a first local oscillation frequency;

a first mixer for up-converting said first filtered signal using said first filtered signal to generate a first up-conversion frequency signal;

a second filter for eliminating unnecessary frequency components from said first up-conversion frequency signal to produce a second filtered signal;

an amplifier for amplifying the second filtered signal to produce a first amplified signal;

a second local oscillator for generating a second local oscillation frequency in response to first control data;

a second mixer for up-converting said first up-conversion frequency signal using said second local oscillation frequency to produce a second up-conversion frequency signal;

a third filter for eliminating unnecessary frequency components from said second up-conversion frequency signal to produce an output transmission signal;

an attenuator for controlling the magnitude of said third filtered signal while suppressing unwanted frequency components generated from the up-conversion of said first up-conversion frequency signal into said second up-conversion frequency signal using said second local oscillation frequency irrespective of amplification and attenuation when the input transmission signal is up-converted into said output transmission signal; and a transceiver slave control unit responsive to said second oscillation frequency signal for generating a control signal for controlling said attenuator.

9. The output control unit of claim 8, wherein said transceiver slave control unit comprises:

an interface unit for generating said control data for controlling said second local oscillator to generate said second local oscillation frequency, wherein said local oscillator informs said interface unit that it is locked to a frequency of a designated channel when generating said second local oscillation frequency;

a main processor unit for detecting that the second local oscillator is tuned to the designated channel in response to an output from said interface unit indicating that said local oscillator is locked to the frequency of the designated channel;

a control memory for storing a control voltage conversion table of digital-to-analog conversion step values, wherein said main processor unit searches for an output attenuation value of the designated channel in a channel conversion table and accesses the control version conversion table to determine a digital-to-analog conversion step value corresponding to the output attenuation value of the designated channel; and a digital-to-analog converter for converting the digital-to-analog conversion step value transmitted from the main processor unit into said control signal for controlling said attenuator.

10. A method of controlling an output characteristic of a radio communication system which comprises a transmit up-converter board for frequency up-converting an input transmission signal and an attenuator for controlling the gain of an output transmission signal in a state of readiness for transmission, said method comprising the steps of:

setting a channel as a reference channel, changing a control voltage of the attenuator sequentially, measuring output attenuation data due to the changing control voltage, and preparing a control voltage conversion table corresponding to the output attenuation data measured;

measuring the output characteristic as the channels are varied in sequence, and preparing a channel conversion table for storing the relative output attenuation data as against the output attenuation data of the reference channel;

searching for the output attenuation data, of a designated channel, stored in the channel conversion table, accessing the control voltage, corresponding to the output attenuation data stored in the control voltage conversion table, and applying the control voltage to the attenuator for controlling the gain of said output transmission signal.

11. A method of controlling an output of a digital mobile communication system which comprises a transmit up-converter board for up-converting a frequency of an input transmission signal, and a memory including a control voltage conversion table and a channel conversion table, said method comprising the steps of:

setting a transmission channel of the transmit up-converter board; and searching for output attenuation data, of the transmission channel, stored in the channel conversion table, accessing a control voltage, corresponding to the output attenuation data stored in the control voltage conversion table, and applying the control voltage to an attenuator for controlling gain of an output transmission signal in response to the control voltage.

12. The method of claim 11, further comprising the steps of:

storing, in said control voltage conversion table, measured control voltages corresponding to the output attenuation data which which depend on sequential changes of the control voltage of the attenuator at a reference channel; and storing, in said channel conversion table, measured output attenuation characteristics which vary depending on sequential changes of the channels.

* * * * *